(12) United States Patent
Capote et al.

(10) Patent No.: US 6,335,571 B1
(45) Date of Patent: Jan. 1, 2002

(54) SEMICONDUCTOR FLIP-CHIP PACKAGE AND METHOD FOR THE FABRICATION THEREOF

(75) Inventors: Miguel Albert Capote, Carlsbad; Xiaoqi Zhu; Robert Vinson Burress, both of San Diego; Yong-Joon Lee, Oceanside, all of CA (US)

(73) Assignee: Miguel Albert Capote, Carlsbad, CA (US)

( * ) Notice: Subject to any disclaimer, the term of this patent is extended or adjusted under 35 U.S.C. 154(b) by 0 days.

(21) Appl. No.: 09/517,839

(22) Filed: Mar. 2, 2000

Related U.S. Application Data

(63) Continuation-in-part of application No. 09/137,971, filed on Aug. 21, 1998, now Pat. No. 6,297,560, and a continuation-in-part of application No. 09/120,172, filed on Jul. 21, 1998, now Pat. No. 6,121,689, and a continuation of application No. 09/012,382, filed on Jan. 23, 1998, now Pat. No. 6,017,634, which is a continuation of application No. 08/926,159, filed on Sep. 9, 1997, now Pat. No. 5,985,456, and a continuation of application No. 08/897,968, filed on Jul. 21, 1997, now Pat. No. 5,985,043.

(60) Provisional application No. 60/056,043, filed on Sep. 2, 1997, and provisional application No. 60/053,407, filed on Jul. 21, 1997.

(51) Int. Cl.[7] .......................... H01L 23/28; H01L 23/29
(52) U.S. Cl. ................ 257/787; 257/788; 257/790; 257/792; 257/778; 257/737
(58) Field of Search .................... 257/787, 788, 257/790, 792, 778, 737; 438/112, 124, 127

(56) References Cited

U.S. PATENT DOCUMENTS

| | | | |
|---|---|---|---|
| 5,088,189 A | 2/1992 | Brown | 29/840 |
| 5,128,746 A | 7/1992 | Pennisi et al. | 257/673 |
| 5,136,365 A | 8/1992 | Pennisi et al. | 257/788 |
| 5,349,240 A | 9/1994 | Narita et al. | 257/791 |
| 5,376,403 A | 12/1994 | Capote et al. | 426/96 |
| 5,587,342 A | 12/1996 | Lin et al. | 438/96 |
| 5,629,566 A | 5/1997 | Doi et al. | 257/789 |
| 5,710,071 A | 1/1998 | Beddingfield et al. | 438/108 |
| 5,729,440 A * | 3/1998 | Jimarez et al. | 361/779 |
| 5,742,100 A | 4/1998 | Schroeder et al. | 257/778 |
| 5,751,068 A | 5/1998 | McMahon et al. | 257/737 |
| 5,770,476 A | 6/1998 | Stone | 438/106 |
| 5,801,072 A | 9/1998 | Barber | 438/106 |
| 5,801,449 A | 9/1998 | Dehaine et al. | 257/779 |
| 5,861,323 A | 1/1999 | Hayes | 438/111 |
| 5,985,043 A | 11/1999 | Zhou et al. | 148/25 |
| 5,985,456 A | 11/1999 | Zhou et al. | 428/414 |
| 6,077,380 A * | 6/2000 | Hayes et al. | 156/283 |

FOREIGN PATENT DOCUMENTS

EP 0655799 A1 5/1995
WO WO99/56312 11/1999

* cited by examiner

Primary Examiner—Jhihan B Clark
(74) Attorney, Agent, or Firm—Burns, Doane, Swecker & Mathis, L.L.P.

(57) ABSTRACT

A flip-chip device and process for fabricating the device employs a multilayer encapsulant that includes a first portion encapsulant having a coefficient of thermal expansion of at most 30 ppm/° C. and an elastic modulus of 2–20 GPa and a second portion comprising a polymer flux having a coefficient of thermal expansion that may exceed 30 ppm/° C.

10 Claims, 11 Drawing Sheets

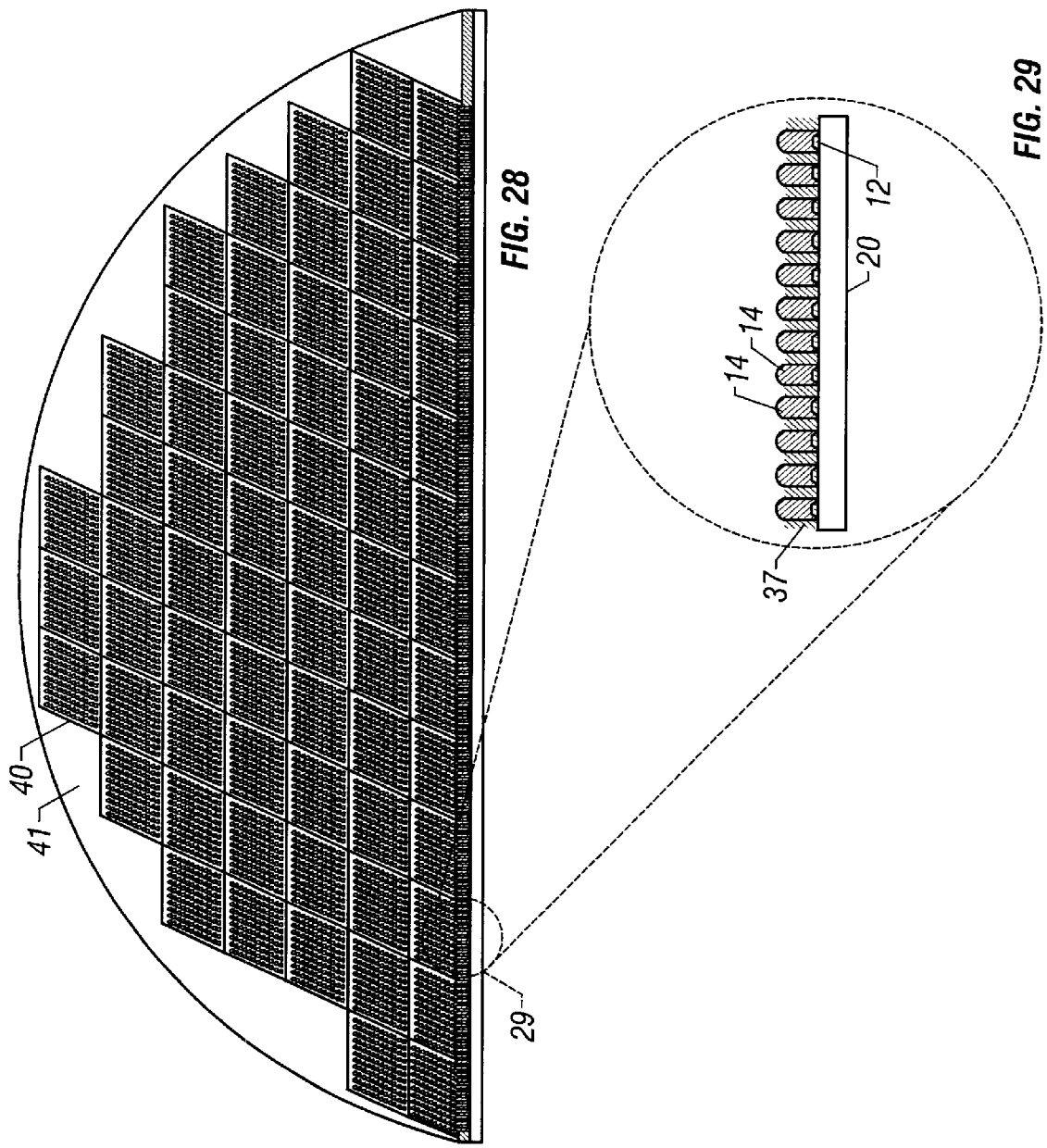

US 6,335,571 B1

SEMICONDUCTOR FLIP-CHIP PACKAGE AND METHOD FOR THE FABRICATION THEREOF

This application claims priority under 35 U.S.C. §§119 and/or 365 to 09/120,172 filed in the United States on Jul. 21, 1998, now U.S. Pat. No. 6,121,689; 09/137,971 filed in the United States on Aug. 21, 1998, now U.S. Pat. 6,017, 634; 60/053,407, filed in the United States on Jul. 21, 1997; 08/897,968 filed in the United States on Jul. 21, 1997, now U.S. Pat. No. 5,985,456; 08/926,159 filed in the United States on Sep. 9, 1997, now U.S. Pat. No. 5,985,456; the entire contents of which are hereby incorporated by reference.

The U.S. Government has a paid-up license in this invention and the right in limited circumstances to require the patent owner to license others on reasonable terms as provided for by the terms of contract no. N00164-96-C-0089 awarded by Defense Advanced Research Projects Agency.

FIELD OF THE INVENTION

This invention relates generally to semiconductor chips electrically and mechanically connected to a substrate, particularly to flip-chip configurations.

BACKGROUND OF THE INVENTION

Flip-chip technology is well known in the art. FIG. 1 illustrates a semiconductor chip having solder bumps formed on the active side of the semiconductor chip 100 that is inverted and bonded to a substrate 101 through the solder joints 102 by reflowing solder to wet metallized pads 106. Structural solder joints 102 are formed from solder bumps situated between the semiconductor chip and the substrate to form the mechanical and electrical connections between the chip and substrate. A narrow gap 103 is left between the semi-conductor chip and the substrate.

One obstacle to flip-chip technology when applied to polymer printed circuit substrates (i.e., circuit boards) is the unacceptably poor reliability of the solder joints due to the mismatch of the coefficients of thermal expansion of the (i) chip, which typically has a coefficient of thermal expansion of about 3 ppm/° C., (ii) the polymer substrate, e.g. epoxy-glass, which has a coefficient of thermal expansion of about 16 to 26 ppm/° C., and (iii) the solder joint which has a coefficient of thermal expansion of about 25 ppm/° C. As shown in FIGS. 2 and 3, as the flip chip 100 and printed circuit substrate 101 undergo thermal excursions, the substrate expands and contracts at a greater rate than does the chip. (This occurs, for example, in electronic components that are switched on and off.) Because the chip and substrate are stiffer than the solder joints 104, the solder joints are flexed and distorted since they are constrained only by their attachment at both ends by the substrate and chip. The air gap 103 between the chip and the substrate allows these two parts to expand and contract at relatively different rates thereby distorting the solder joints. As the chip and substrate are thermally cycled through normal use, this flexing and bending weakens the solder joints which causes them to quickly fail.

In the past, the problem of solder joint fatigue life in flip-chip/substrate interconnects was addressed by several methods. A typical approach, which is described in U.S. Pat. No. 5,801,449, involves positioning an interposer made of flexible circuitry between the chip and the solder joints. The flex circuit undergoes expansion and contraction without distorting the solder joints despite the presence of the air gap around the solder joints.

As illustrated in FIG. 4, another approach to fatigue life involves underfilling the air gap between the chip and the substrate completely with a solid underfill encapsulant material 104 that consists of a composite of polymer and an inorganic filler and that has a thermal expansion of 20–30 ppm/° C. and an elastic modulus of 2–20 GPa. The underfill composite material is typically dispensed around two adjacent sides of the semiconductor chip after the chip 100 has been soldered to the substrate 101. The underfill composite material 104 slowly flows by capillary action to fill the gap between the chip and the substrate. The underfill material is then hardened by baking for an extended period. Underfilling the chip with a subsequently cured encapsulant has been shown to reduce solder joint fatigue failure caused by thermal expansion mismatch between the chip and the substrate. For the underfill encapsulant to be effective, it is important that it adheres well to the chip 100 and the substrate 101. Unlike the previous interposer methods, there cannot be an air gap or separation between the underfill 104 and the chip 100 or the substrate 101. The cured encapsulant reduces the fatigue cycling of the solder joints by virtue of the relative stiffness, or high modulus, of the underfill material in conjunction with the strong solid contact made between the underfill material, the semiconductor chip, the solder joints, and the underlying printed circuit.

As illustrated further in FIGS. 5 and 6, since the solid underfill composite 104 fills the entire gap between the chip 100 and the substrate 101, and since it has a thermal expansion coefficient that is close to that of the solder 102, the substrate and chip no longer expand and contract independently of each other. Instead the relatively larger expansion and contraction of the substrate relative to the chip is constrained by the underfill 104 which is rigidly adhered to both; this also causes the entire assembly to bulge upwards as the temperature is decreased or downwards as the temperature is increased. This bulging effect essentially keeps the relatively fragile solder joints encased solidly in the underfill, and prevents them from appreciably distorting. The result is a large reduction in solder joint fatigue. The hardened, gap-free encapsulant transforms the expansion and contraction forces of the substrate that are induced by temperature changes, into bulging of the entire assembly, which virtually eliminates distortion of the solder joints. The bulging reduces the fatigue of the solder joints and virtually eliminates solder fatigue failure. As a result, the underfilled flip chip assembly solder joint lifetime is greatly increased relative to that of an air gap flip chip solder joint.

The underfilling process, however, makes the assembly of encapsulated flip-chip printed wire boards a time consuming, labor intensive and expensive process with a number of uncertainties. The process involves first applying a soldering flux, generally a no-clean, low residue flux, to the solder bumps on the chip. Then the chip is placed on the substrate. The assembly is subsequently subjected to a solder reflowing thermal cycle whereby the solder melts and joins the chip to the substrate under the action of the soldering flux. The surface tension of the solder aids to self-align the chip to the substrate terminals. After reflow, due to the close proximity of the chip to the substrate, removing any remaining flux residues from under the chip is such a difficult operation that it is generally not done. Yet these residues are known to reduce the reliability and integrity of the subsequent underfill encapsulant.

After soldering, underfill encapsulation of the chip generally follows. In the prior art, as described, for example, in U.S. Pat. No. 5,880,530, the polymers of choice for the underfill encapsulation have been epoxy resins. The thermal expansion coefficients and elastic moduli of the resins can be reduced by the addition of inorganic fillers, such as silica or alumina. To achieve optimum reliability, a coefficient of thermal expansion in the vicinity of 20–30 ppm/° C. and an elastic modulus of 2 to 20 Gpa are preferred. Since the preferred epoxies have coefficient of thermal expansion exceeding 80 ppm/° C. and elastic moduli of 0.01–2 GPa, the inorganic fillers selected generally have much lower coefficient of thermal expansions and much higher moduli so that, in the aggregate, the epoxy-inorganic mixture is within the desired range for these values. Typically, the filler to resin volume ratio is in the range of 50 to 65%, but this high filler concentration tends to make the resin mixture very viscous, which slows the rate at which it can flow into the gap between chip and substrate during underfilling. Consequently, the slow underfill process is expensive to perform in a large throughput manufacturing environment.

The underflling encapsulation techniques of the prior art have at least five principal disadvantages:

1. The reflowing of the solder bump and subsequent underfilling and curing of the encapsulant is an inefficient multi-step process.
2. Underfilling a flip-chip assembly is time consuming because the viscous resin material must flow through the tiny gap between the chip and the substrate.
3. Air bubbles can be trapped in the underfill encapsulant during the underfilling process and these bubbles later become sites for solder joint failure.
4. The flux residues remaining in the gap reduce the adhesive and cohesive strengths of the underfill encapsulating adhesive, thereby adversely affecting the reliability of the assembly.
5. For larger chips, the limiting effect of capillary action becomes more critical and makes the underflling procedure more time consuming and more susceptible to void formation and to the separation of the polymer from the fillers during underfilling.

U.S. Pat. No. 5,128,746 describes a prior art method for underfill encapsulation of a chip and substrate assembly whereby a liquid polymer encapsulant, which includes a fluxing agent but no inorganic fillers, is applied to the chip or substrate prior to assembly. As shown in to FIGS. 7 and 8, prior to solder reflow, the liquid encapsulant 109 is applied to completely fill the gap between chip and substrate, and engulf the solder bumps 108. This allows the chip 100 to be positioned on the substrate 101 with the liquid polymer flux 109 situated in between. Then, as shown in FIG. 9, the solder bumps 108 are reflowed during which process the flux in the liquid encapsulant promotes wetting of the molten solder to the metallized pads 106 on the substrate as the solderjoints or interconnections 102 are formed and the chip self-aligns to the metallized pads. The polymer in the liquid encapsulant cures during the reflow step and hardens to produce mechanical interconnection 110 located between the substrate and chip and to encapsulate the solder joints 102.

One advantage of this technique is that the reflow and underfilling steps are combined into one, thereby eliminating the slow underfill operation since the encapsulating underfill is applied prior to assembly. However, the chief limitation of this technique is that in order for the molten solder to readily wet the substrate metallized pads and to allow the solder, through surface tension, to self-align the chip to the substrate metallized pads, the polymer flux encapsulant must have a very low viscosity during the reflow step. However, the viscosity of the material is severely increased by the presence of inorganic fillers above a concentration of more that a few percent. As a result, the thermal expansion coefficients of these unfilled polymer flux encapsulant materials are much larger than 20–30 ppm/° C. and the elastic moduli are less than 2 GPa. This approach fails to produce an underfill encapsulant material that can serve as both the flux and the encapsulant with the required low coefficient of thermal expansion and high modulus needed for optimum reliability.

The art is in need of a method to pre-apply an underfill encapsulant containing the required inorganic fillers to fill completely the gap between the chip and substrate in such a way that the coefficient of expansion of the material in the gap is near that of the solder, 25 ppm/° C., and the modulus is at least 2 GPa.

SUMMARY OF THE INVENTION

The present invention is based in part on the discovery of employing a multilayer underfill encapsulant that comprises at least first and second portions or layers, at least one of which comprises a polymer flux. The use of two or more layers allows the layers to have different physical properties as measured by their thermal expansion coefficients and elastic moduli. Electrical components such as flip-chips employing the inventive layers have superior structural integrity. Since the polymer flux generally has a coefficient of expansion exceeding 30 ppm per degree C., this multilayer approach allows the use of polymer fluxes without adversely affecting reliability at the final assembly.

In one aspect, the invention is directed to an electrical component assembly that includes:

(a) a substrate having a substrate surface with a plurality of pads thereon;

(b) an integrated circuit chip having an active surface with a plurality of contacts thereon wherein the substrate surface faces the active surface; and (c) an encapsulant interposed between substrate and the integrated circuit chip wherein the encapsulant comprises at least two layers including a first layer comprising a polymer or polymer composite having a coefficient of thermal expansion of about 30 ppm/° C. or less and an elastic modulus of at least 2 Gpa, and a second layer comprising a polymer flux wherein the encapsulant defines a plurality of channels that are filled with solder and wherein each channel extends from a contact on the active surface to a pad on the substrate surface.

In another aspect, the invention is directed to a method for making an electrical component assembly that includes the steps of:

(a) providing an integrated circuit chip having an active surface with a plurality of contacts thereon and having discrete solder bumps on the plurality of contacts;

(b) coating the active surface of the integrated circuit chip having separate discrete solder bumps thereon with a first encapsulant layer that comprises a liquid polymer resin mixed with inorganic powder wherein the first encapsulant layer after being cured has a coefficient of thermal expansion of about 30 ppm/° C. or less and an elastic modulus of at least about 2 GPa;

(c) providing a printed circuit substrate having a substrate surface with a plurality of discrete metallized pads thereon;

(d) coating the printed circuit substrate with a second encapsulant layer comprising a liquid polymer flux;

(e) placing the coated integrated circuit chip on the coated substrate whereby the first and second encapsulant layers are in contact with each other and thereafter causing the solder bumps to penetrate into the second encapsulant layer;

(f) curing the first and second encapsulant layers; and (g) simultaneously reflowing the solder bumps to electrically connect the contacts of the integrated circuit chip to the pads of the substrate.

In yet another aspect, the invention is directed to a method for making an electrical component assembly that includes the steps of:

(a) providing an integrated circuit chip that has an active surface with a plurality of contacts thereon and having discrete solder bumps on the plurality of contacts;

(b) coating the active surface of the integrated circuit chip having separate discrete solder bumps thereon with a hardened first encapsulant layer comprising a polymer resin and an inorganic filler wherein the first encapsulant layer after being cured has a coefficient of thermal expansion of 30 ppm/° C. or less and an elastic modulus greater than 2 GPa;

(c) partially exposing tips of the solder bumps;

(d) coating the first encapsulant with a second encapsulant layer comprising a liquid polymer flux;

(e) providing a printed circuit substrate having a substrate surface with discrete metallized pads thereon;

(f) placing the coated integrated circuit chip on the substrate and thereafter causing the solder bumps tips to penetrate into the second encapsulant layer;

(g) curing the first and second encapsulant layers; and (h) simultaneously reflowing the solder bumps to electrically connect the contacts of integrated circuit chip to the pads of the substrate.

In still another aspect, the invention is directed to a method for making an electrical component assembly that includes the steps of:

(a) providing an integrated circuit chip having an active surface with a plurality of contact pads thereon;

(b) coating the active surface of the integrated circuit chip with a first encapsulant layer that after being cured has a coefficient of expansion of about 30 ppm/° C. or less and an elastic modulus greater than about 2 GPa;

(c) removing portions of the first encapsulant layer to form holes that expose the contact pads on the active surface of the integrated circuit chip;

(d) filling the holes with solder;

(e) coating the first encapsulant layer with a second encapsulant layer that comprises a polymer flux;

(f) placing the integrated circuit chip on a substrate having a substrate surface with a plurality of metallized pads thereon with the first and second encapsulant layers located between the integrated circuit chip and the substrate;

(g) curing the second encapsulant layer; and (h) simultaneously reflowing the solder to electrically connect the contact pads of the integrated circuit chip to the metallized pads of the substrate.

In still another aspect, the invention is directed to a method for making an electrical component assembly that includes the steps of:

(a) providing a printed circuit board substrate having a substrate surface with a plurality of metallized pads thereon;

(b) coating the metallization pads with a first encapsulant layer that has a coefficient of expansion of about 30 ppm/° C. or less and an elastic modulus of greater than about 2 GPa;

(c) removing portions of the first encapsulant layer to form holes that expose the metallization pads;

(d) filling the holes with solder;

(e) coating the first encapsulant layer with a second encapsulant layer that comprises a polymer flux;

(f) placing an integrated circuit chip having an active surface with a plurality of contact pads thereon on the substrate with the first and second encapsulant layers located between the integrated circuit chip and the substrate;

(g) curing the second encapsulant layer; and (h) simultaneously reflowing the solder to electrically connect the contact pads of the integrated circuit chip to the metallized pads of the substrate.

The semiconductor chip package structures of the present invention provide, among other advantages, simple chip placement followed by reflow without labor intensive underfill steps; a solder bumped chip or substrate with an encapsulant pre-attached, with the encapsulant performing a mechanical function and the solder performing an electrical function; a low-cost method for applying the solder bumps to a flip chip or flip chip substrate by creating holes in a pre-coated encapsulant; and a pre-coated chip encapsulant of two or more layers, with each layer performing a distinct function.

BRIEF DESCRIPTION OF THE DRAWINGS

FIG. 28 illustrates a flip-chip structure that is applied to a wafer prior to dicing into individual chips.

FIG. 29 is the cross section magnification of a wafer having the flip-chip structure of FIG. 28.

DETAILED DESCRIPTION OF THE PREFERRED EMBODIMENTS

Figure 16:
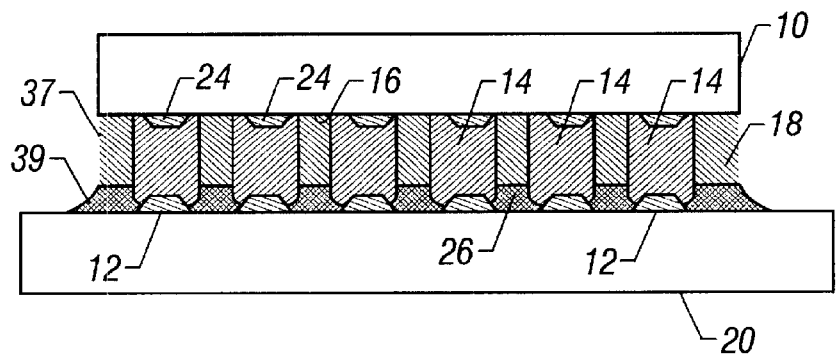
FIG. 16 is a representative flip-chip structure of the present invention.

As illustrated in FIG. 16, an integrated circuit chip 10 is mounted on a substrate 20. A plurality of solder pads 12 on the top surface 26 of the substrate is arranged to receive corresponding solder bumps 14 that are connected to the contact pads 24 of the chip. Each of the solder pads 12 is metallized so as to become solderable and electrically conductive to provide an electrical interconnection between the chip and the substrate. With this flip-chip mounting arrangement, a gap 18 is formed around the solder bumps between the top surface 26 of the substrate 20 and the bottom surface 16 of the chip 10. The gap typically varies from 20 to 300 microns in height and is preferably completely filled with encapsulant materials 37 and 39. The encapsulant materials are rigid compositions and comprise at least two portions 37 and 39.

For example, the encapsulant materials can be deposited as a multilayer structure with alternating layers of materials that have different thermal coefficients of expansion and elastic moduli as further described herein. A preferred structure has two portions (or layers) 37 and 39.

The first portion of the encapsulant 37 comprises a hardened layer of a polymer or polymer composite having a coefficient of thermal expansion of at most 30 ppm/° C. and a modulus of 2 GPa or more. The second portion 39 comprises a hardened polymer flux which generally has a thermal expansion coefficient greater than 30 ppm/° C. and a modulus that may be less that 2 GPa. The coefficient of thermal expansion and elastic modulus are measured at room temperature (i.e., about 25° C.). The thickness of the gap 18 composed of first portion 37 is at least equal to the thickness of the second portion 39. More preferred, the thickness of the first portion 37 is at least 50% more than the thickness of the second portion 39, thus having reduced effect on the reliability of the flip-chip solder interconnections 14 despite the second portion 39 having generally a lower modulus and higher coefficient of thermal expansion than the first portion 37.

In most flip chip assemblies, the distance between the chip and the substrate, which is encapsulated, ranges from about 20 and 300 microns. Further, generally the larger the distance, the less the maximum stress on the solderjoints. To provide for a reliable interconnection, the thickness of the first layer encapsulant is about the same or greater than that of the second. Preferably, the thickness of the first layer encapsulant ranges from about 10 to 250 microns. For smaller interconnect pitches, generally a smaller encapsulant layer is required. In chips having a 100 to 250 micron joint pitch, the preferred thickness for the encapsulant is 20 to 150 microns; as a corollary, the first encapsulant layer thickness preferably is in the range of about 10 to 130 microns. The smallest chip pitches will require very thin encapsulant layers. A 50 to 100 micron pitch chip will have a total encapsulant thickness ranging from 20 to 75 microns, therefore, a particularly preferred thickness for the first encapsulant layer ranges from about of 10 to 65 microns.

In a particularly preferred structure, the volume of the first portion 37 is greater than two times the volume of the second portion 39 and the second portion 39 is no more than about 30 microns thick at the thickest point. An advantage of constituting the encapsulant with two layers is that the majority of the underfill encapsulant has the essential properties needed to reduce solder joint fatigue, namely, a completely solidly-filled gap 18 between chip 10 and substrate 20 with a material 37 generally having a coefficient of thermal expansion at most 30 ppm/° C. and an elastic modulus greater than 2 GPa. Yet the thin portion of the polymer flux 39 provides good solder wetting and spread during reflow, aiding in self alignment of the chip to the substrate metallization.

In one embodiment of the flip chip multilayer encapsulant structure, the encapsulant layers exhibit a gradient in thermal expansion and modulus between the substrate and the chip. This means that in an ideal configuration, the encapsulant layer applied to the chip should have an expansion coefficient and modulus that are nearer to those of the chip and the encapsulant layer applied to the substrate should have an expansion coefficient and modulus that are nearer to those of the substrate. Overall, the composite expansion coefficient for the entire encapsulant should be comparable to the expansion coefficient of the solder (about 25 ppm/° C.) to minimize stress on the solder. Since the expansion coefficient of the polymer flux layer is generally greater than about 30 ppm/° C., the expansion coefficient of the first encapsulant layer should be about 10 to 30 ppm/° C. Preferably, the first encapsulant layer has an expansion coefficient closer to that of the solder, i.e., 12 to 28 ppm/° C. A particularly preferred range is about 18 to 27 ppm/° C. which minimizes the stress on the solder joint for the first encapsulant. Similarly, the modulus should range from about 2 to 12 Gpa. The highest moduli will produce the largest shear stress on the encapsulant at the chip-to-encapsulant interface and may even exceed the adhesive strength of the encapsulant. Therefore, a preferred modulus range is about 3 to 10 GPa and a more preferred range is about 3 to 8 GPa.

Referring to FIG. 16, one preferred composition for the first portion 37 is a polymer resin that is filled with a sufficient amount of silica powder to produce the desired coefficient of thermal expansion and elastic modulus. Alternatively, the first portion comprises a polymer having an intrinsically high elastic modulus and low coefficient of thermal expansion in the plane of the structure as compared to the second portion, such as polyimide films sold under the trade name UPILEX and available from Oxychem, Grand Island, N.Y. Other conventional encapsulants can be employed. Preferably, the first portion comprises a mixture comprising silica or alumina powder and a polymerizable, hardened resin, such as, e.g., an epoxy.

A number of flux compositions suitable for the second portion of the encapsulant 39, are described in U.S. Pat. Nos. 5,376,403, 5,088,189, 5,136,365 and 5,128,746, which are incorporated herein by reference. One type of polymer flux composition useful for the second portion 39 is a mixture of epoxy resins, anhydride or amine curing agents, and organic acids such as adipic or malic acid. Such polymer fluxes are available commercially as SE-CURE from the Kester Solder Company, Des Plaines, Ill. A preferred composition is directed to fluxing adhesive compositions that include a fluxing agent comprising a single active component which is capable of functioning as both a primary fluxing agent and a self-polymerizing monomer. Generally, depending upon the intended end use, the thermally curable adhesive composition comprises (a) a fluxing agent having a carboxylic acid group and one or more carbon-carbon double bonds capable of self-polymerization, (b) a crosslinkable diluent capable of polymerizing with the carbon-carbon double bonds of the fluxing agent, (c) optionally, a free-radical initiator, and (d) an epoxide. Such preferred compositions are described in U.S. Pat. Nos. 5,985,456 and 5,985,043 which are incorporated herein by reference.

Figure 1:
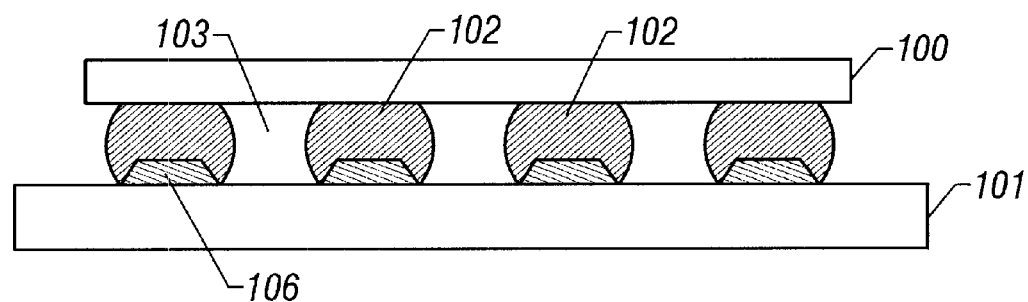
FIGS. 1–9 illustrate prior art flip-chip assemblies.
Figure 2:
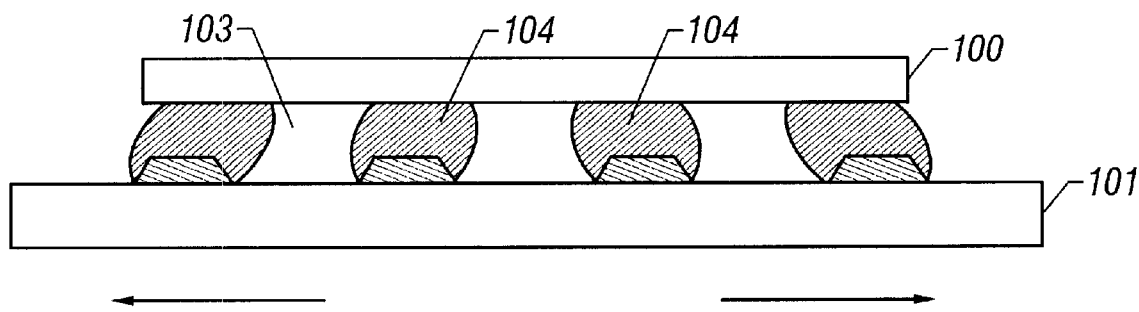
Figure 3:
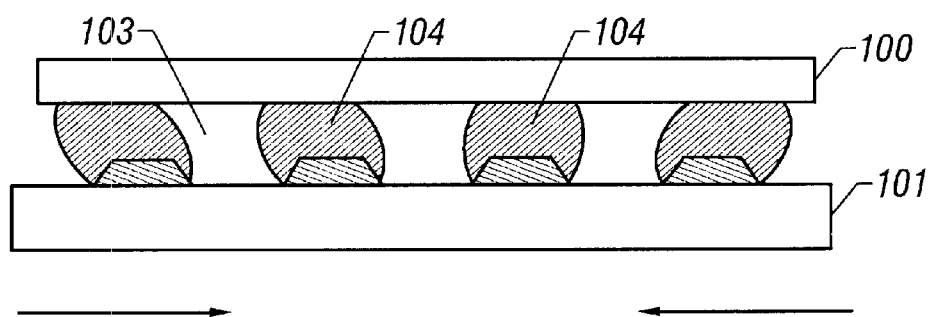
Figure 4:
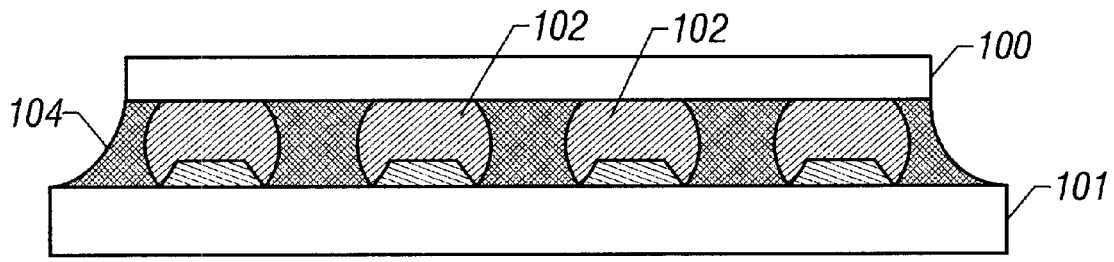
Figure 5:
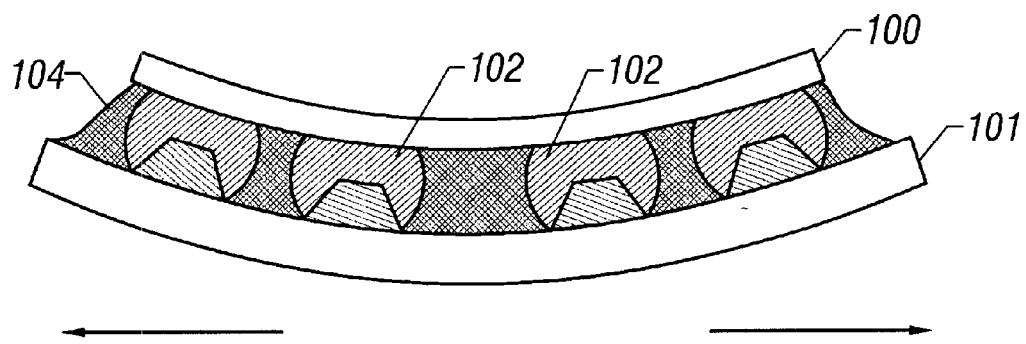
Figure 6:
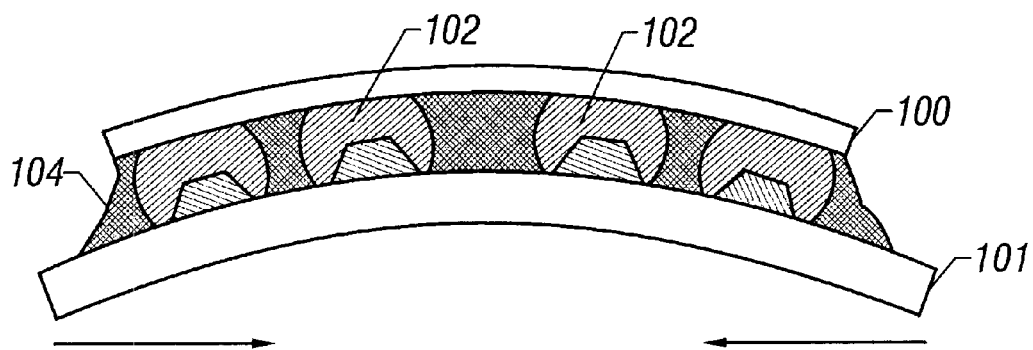
Figure 7:
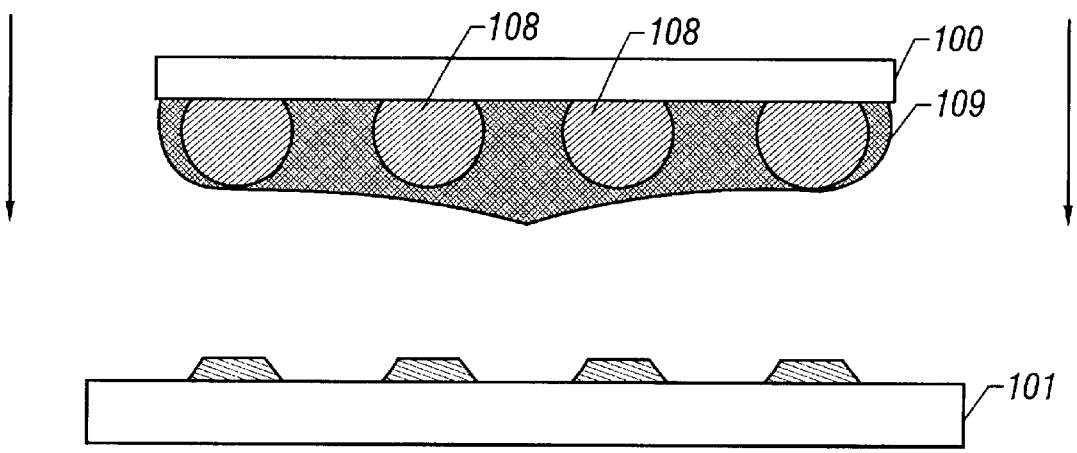
Figure 8:
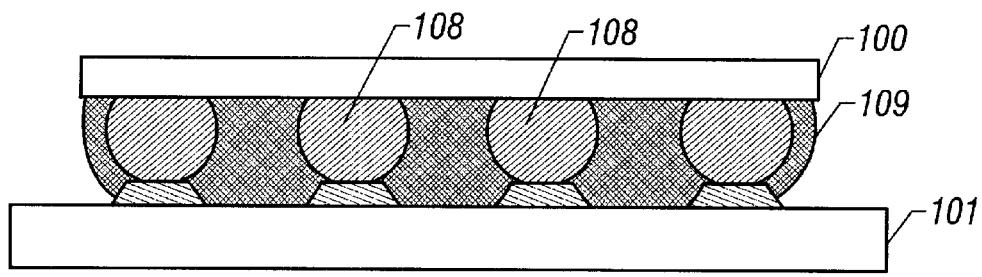
Figure 9:
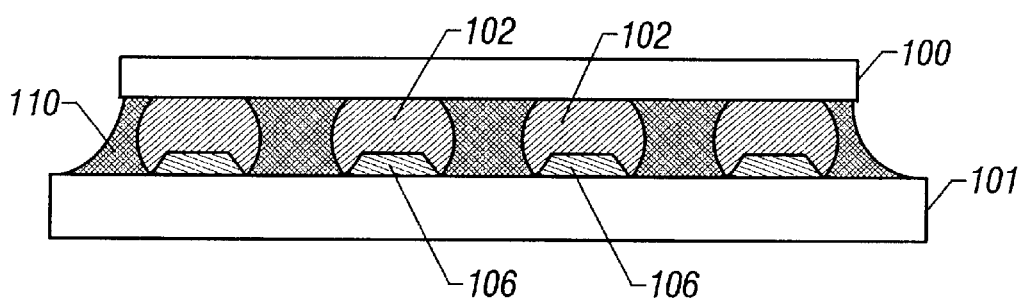
Figure 10:
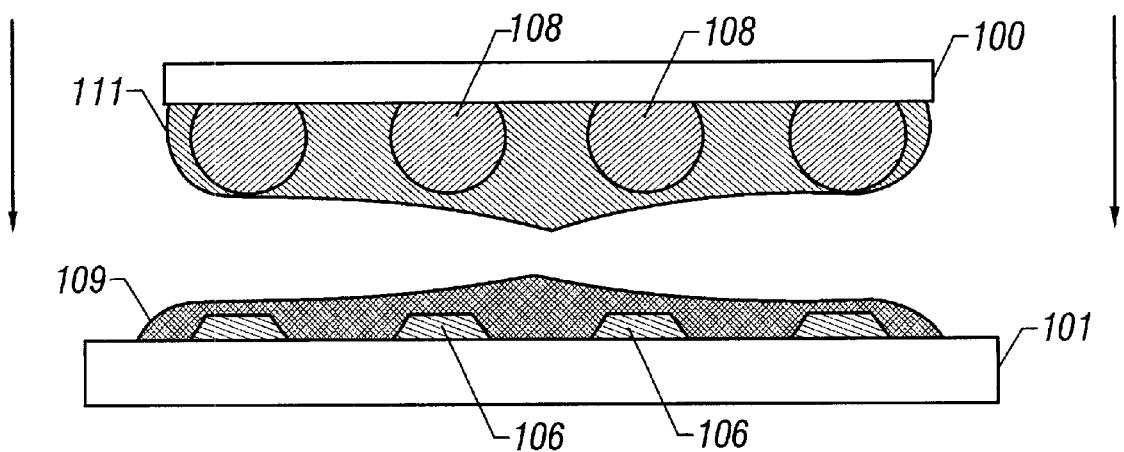
FIGS. 10–12 illustrate a flip-chip assembly process.

FIG. 10 shows a flip-chip structure prior to being assembled. The chip 100, with separate discrete solder bumps 108 pre-assembled thereon, is coated with the first portion of a two-portion encapsulant 111 prior to being assembled to the substrate 101. The major encapsulant portion 111 comprises a liquid polymer resin that is filled with inorganic powder such that after full cure the encapsulant portion has a coefficient of expansion of at most 30 ppm/° C. and an elastic modulus greater than 2 GPa. The encapsulating material 111 is uniformly spread across the surface of the chip and between the solder bumps 108 to cover the remainder of the chip. The first portion of encapsulant material 111 is applied to the chip in liquid form.

The second portion 109 comprises a conventional polymer flux. The second portion is applied in liquid form to the substrate and most preferably remains liquid during the reflow operation. As further shown in FIG. 11, the chip 100, is then positioned so that the solder bumps 108 face the substrate 101 and is aligned with the solder pads 106 of the substrate. The chip assembly 100, with its solder bumps 108 and first portion encapsulant layer 107, is then moved into intimate contact with the substrate 101 and solder pads 106, respectively, such that the two liquid encapsulant portions 107 and 109 lie between the two parts and the tips of the solder bumps 108 have been squeezed through the first portion encapsulant 107 and now reside in the second portion encapsulant 109.

Figure 12:
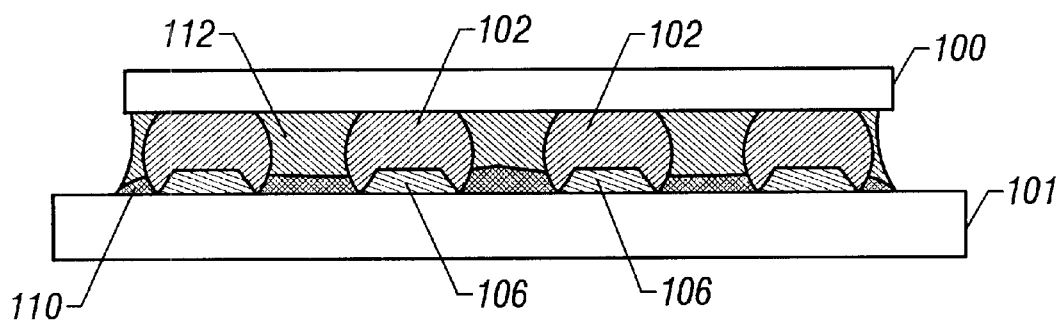

Finally, as shown in FIG. 12, the assembly is then heated preferably using convection reflow technology to cure the liquid encapsulants to form encapsulants 110 and 112 and to reflow the solder thereby attaching the solder interconnections or joints 102 to the contact pads 106 of the substrate. The encapsulants 110 and 112 provide a continuous seal between the chip 100 and the substrate 101 completely engulfing the solder interconnections 102. In this process, most preferably, the encapsulants are essentially completely free of entrapped gas bubbles or voids that can lead to increased fatigue on the solder interconnections 102 during subsequent thermal cycling.

Figure 13:
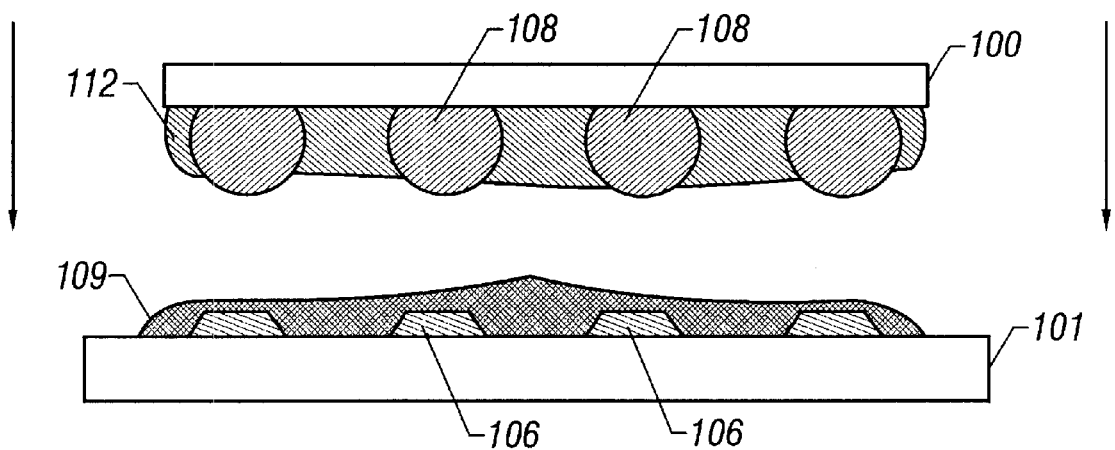
FIG. 13–15 illustrate another flip-chip assembly process.

FIG. 13 shows another flip-chip structure prior to being assembled. The chip 100, with separate solder bumps 108 pre-assembled thereon, is coated with the first portion of a two-portion encapsulant 112 prior to assembly to the substrate 101 in such a way that the tips of the solder bumps remain exposed. The major encapsulant portion 112 comprises a solid polymer resin that is filled with inorganic powder such that it has a coefficient of expansion of at most 30 ppm/° C. and an elastic modulus greater than 2 GPa after being fully cured. (The first encapsulant can be, but does not need to be, fully cured at this stage.) The first portion encapsulating material is first uniformly spread in liquid form across the surface of the chip 100 and between the solder bumps 108 covering the remainder of the chip 100, but leaving the tips of the solder bumps uncoated, then it is subsequently hardened. This can be accomplished by stencil printing the first portion encapsulant selectively to avoid the solder bumps, then hardening it. Another method involves first applying to the solder bumps 108 a temporary protective coating that repels the encapsulant to keep the encapsulant 112 off the solder bumps 108. A suitable temporary coating is the No. 60 screen filler available from Ulano, Brooklyn, N.Y. Such temporary coatings can melt away or dissolve away after curing the first portion encapsulant. Subsequently, the first portion encapsulant 112 is hardened and the temporary coating is removed to expose the solder bumps. An alterative method is to apply the first portion encapsulant 112 to the chip in liquid form, hardening it, and then scrubbing the top surface of the encapsulant 112 off the solder bumps 108 by chemical etching or plasma scrubbing.

Figure 14:
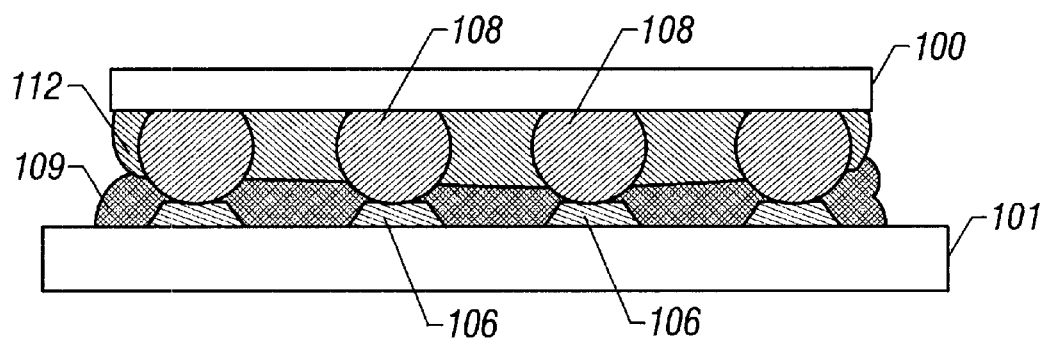
Figure 15:
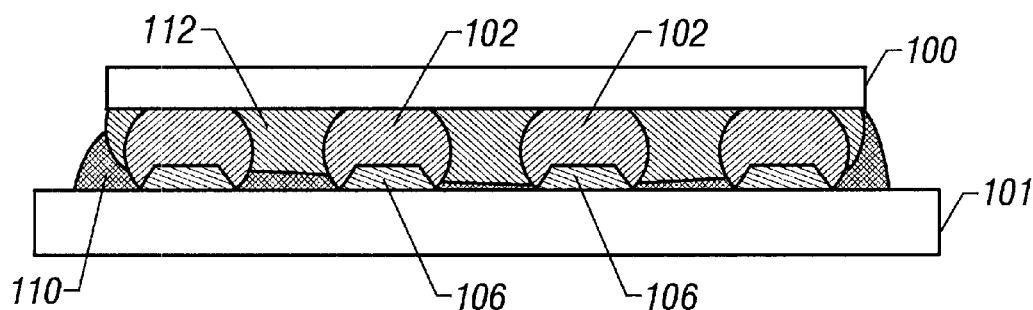

The second portion 109, which comprises a polymer flux as previously described, is applied in liquid form on the substrate 101 or on the pre-encapsulated chip and hardened first portion encapsulant 112 and most preferably remains liquid during the reflow operation. The chip 100 is then positioned so that the solder bumps 108 face the substrate 101 and is aligned with the solder pads 106 of the substrate 101. As shown in FIG. 14, the chip 100, with its solder bumps 108 and first portion encapsulant layer 112, is moved into intimate contact with the substrate 101 and solder pads 106, respectively, such that the two encapsulant portions 109 and 112 lie between the two parts and the tips of the solder bumps 108 now reside in the second portion encapsulant 109. Finally, as shown in FIG. 15, the assembly is then heated using convection reflow technology to harden the encapsulant 110 and to reflow the solder, thereby attaching the solder joints 102 to the contact pads 106 of the substrate.

Figure 17:
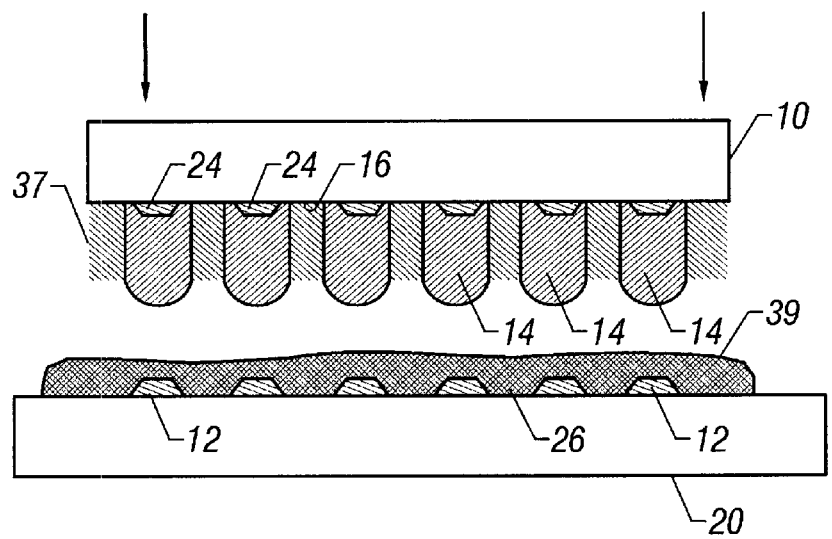
FIG. 17 illustrates a flip-chip structure wherein the first portion of the encapsulant material is applied to the bumped chip and the second portion is applied over the substrate.
Figure 18:
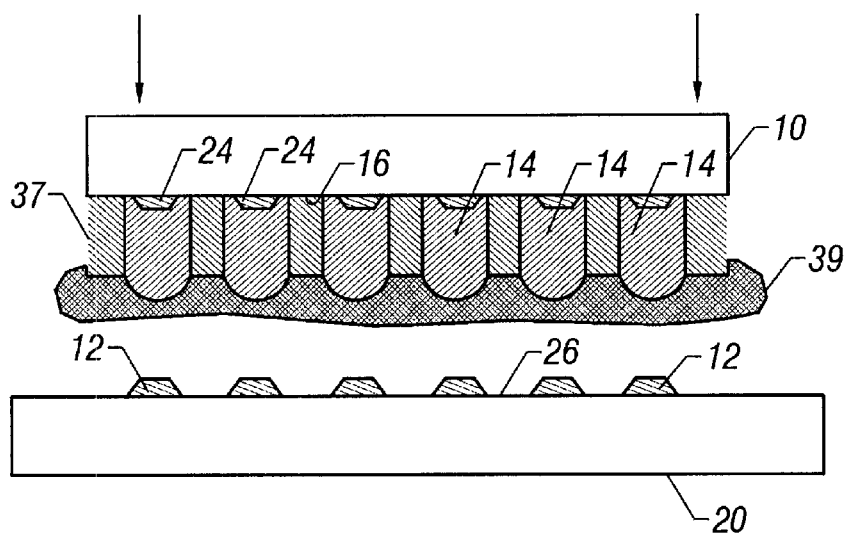
FIG. 18 illustrates a flip-chip structure wherein the first portion of the encapsulant material is applied to a bumped chip and the second portion is applied over the first portion.

FIGS. 17 and 18, illustrate techniques whereby the chip 10 with separate discrete solder bumps 14 pre-assembled thereon is precoated with the first portion of a two-portion encapsulant 37 prior to being assembled to the substrate 20. The major encapsulant portion 37 comprises a solid polymer resin that is filled with inorganic powder such that after full cure the encapsulant portion has a coefficient of expansion of at most 30 ppm/° C. and an elastic modulus greater than 2 GPa. The encapsulating material 37 is uniformly spread across the surface 16 of the chip 10 between the solder bumps 14 covering the remainder of the chip 10. The first portion of the encapsulant material 37 is applied to the chip in either liquid or laminated adhesive tape form, then hardened. The second portion 39 comprises a polymer flux such as those known in the prior art. The second portion 39 is applied in liquid form to either the chip 10 or the substrate 20, as shown in FIGS. 18 and 17, respectively. However, in either case, the second portion most preferably remains liquid during the reflow operation. Alternately, the second portion 39 may be applied as a solid or viscous liquid that melts to a low viscosity liquid during reflow operation to either the chip or substrate as shown in FIGS. 18 and 17, respectively.

Finally, chip 10 is then positioned so that the solder bumps 14 face the substrate 20 and aligned with the solder pads 12 of the substrate. In both embodiments, the solder bumps 14 protrude beyond the first portion encapsulant 37 after the encapsulant coating step. The chip assembly 10 with its solder bumps 14 and encapsulant are moved into intimate contact with the substrate 20 and solder pads 12, respectively, such that the second portion encapsulant 39 lies between the two parts. The assembly is heated to harden the encapsulant 39 and simultaneously reflow the solder 14 using convection reflow technology, preferably in a nitrogen blanket, to attach the solder joints that form to the contact pads 12 of the substrate 20. Other heating and reflow and curing techniques, known to those skilled in the art, are possible. The encapsulant 37 and 39 provides a continuous seal between the chip 10 and the substrate 20.

Figure 19:
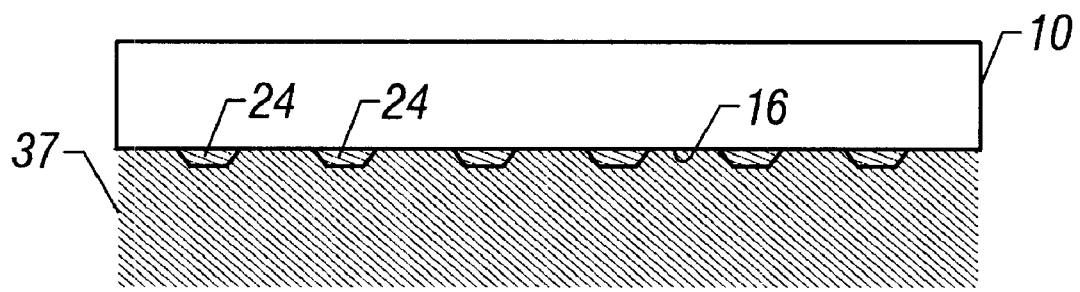
FIGS. 19–21 illustrate a method for applying solder bumps to a chip.
Figure 20:
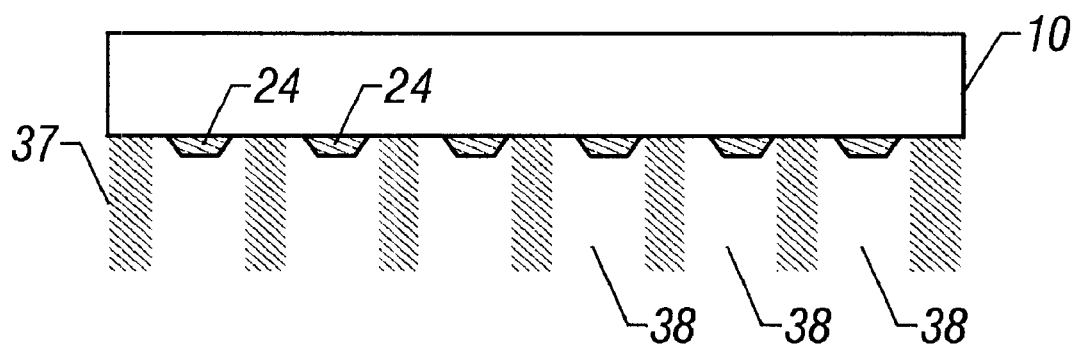
Figure 21:
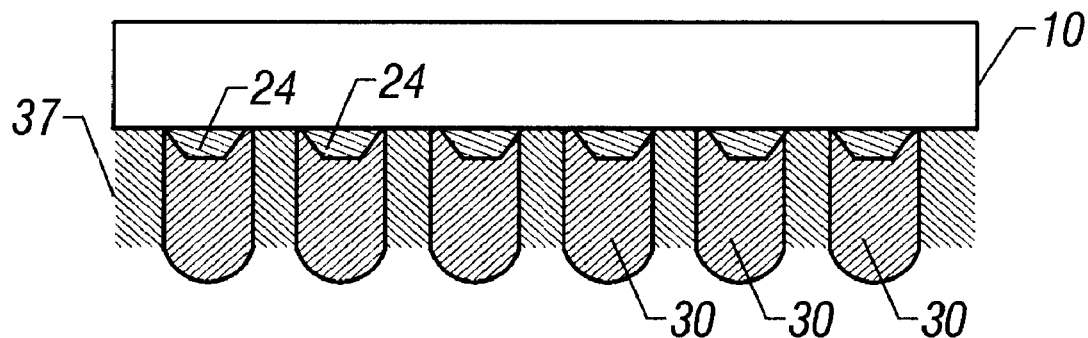

FIGS. 19–21 illustrate a method for creating the solder bumps where the first portion of the encapsulant 37 is solid and the first portion is applied to the chip 10 prior to the solder bumps 30 being applied. Openings 38 are created in the solid first portion 37 that expose underlying chip metallization pads 24. These openings 38 can be created by printing the first portion 37 with the openings 38 in place or by subsequently imaging and developing the first portion encapsulant or drilling the first portion 37 with lasers, plasmas, or chemical enchants or other means know in the art. Alternatively, if the first portion is applied in a laminated tape form, the openings may be drilled or punched in the tape prior to application to the chip. This would require that the openings in the tape be aligned with the metallization pads on the chip. The openings 38, being subsequently cleared of debris and contaminants by plasma etching, chemical etching, ultrasonic cleaning or other methods known to the art, are then filled with solder 30 by plating or solder paste filling, as shown in U.S. Pat. No. 5,587,342 and European Patent Application 94203167.5, solder jetting, or solder injection molding, as shown in U.S. Pat. No. 5,244, 143 which are all incorporated herein by reference. The paste method has the advantage of leaving the thick stencil layer permanently attached to the chip so that it becomes part of the chip underfill encapsulant.

Figure 22:
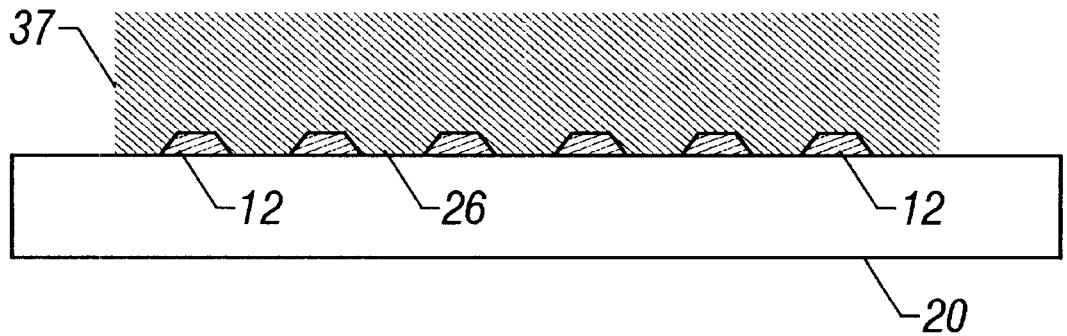
FIGS. 22–24 illustrate a method for applying solder bumps to a substrate.
Figure 23:
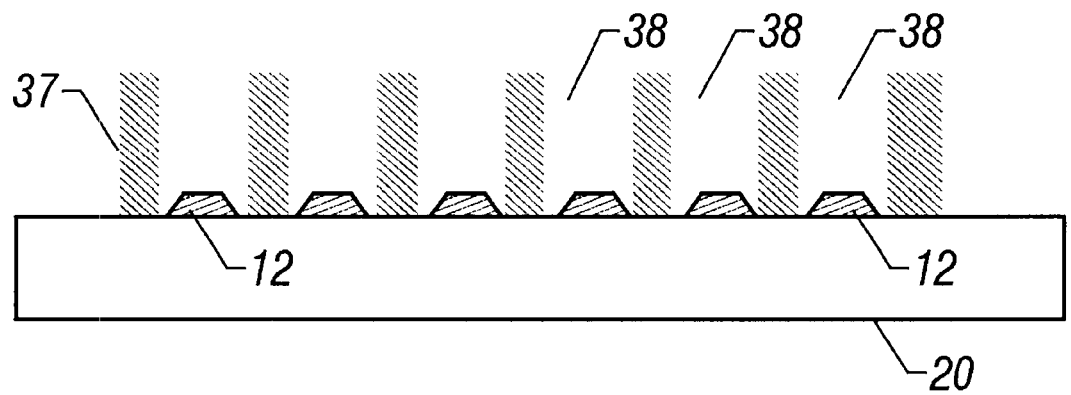
Figure 24:
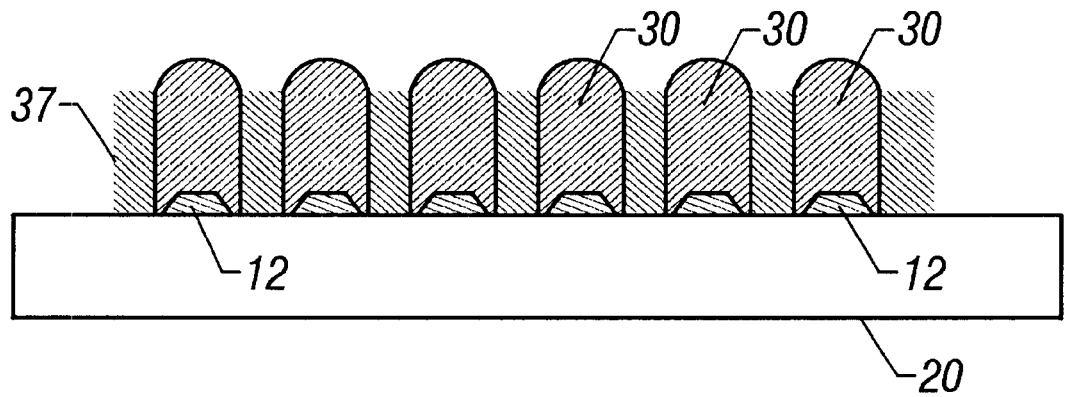
Figure 25:
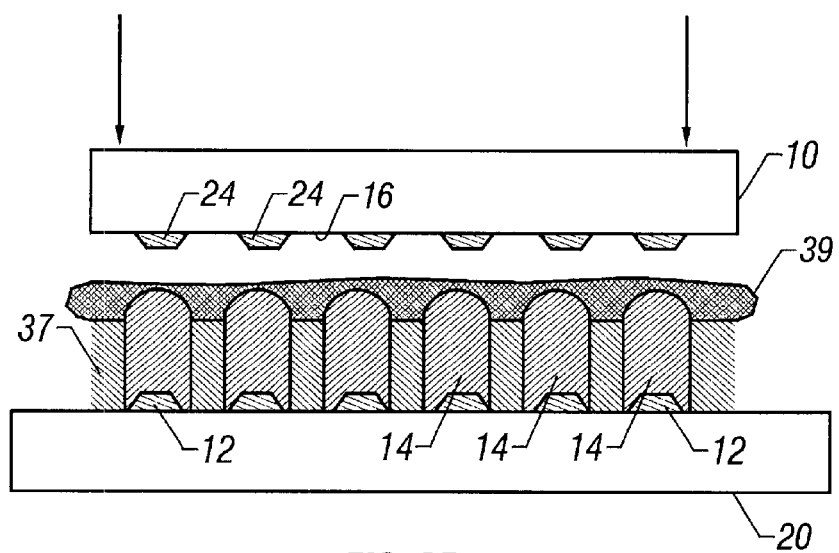
FIG. 25 illustrates a flip-chip structure wherein the first portion of the encapsulant material is applied to a bumped substrate and the second portion is applied over the first portion.
Figure 26:
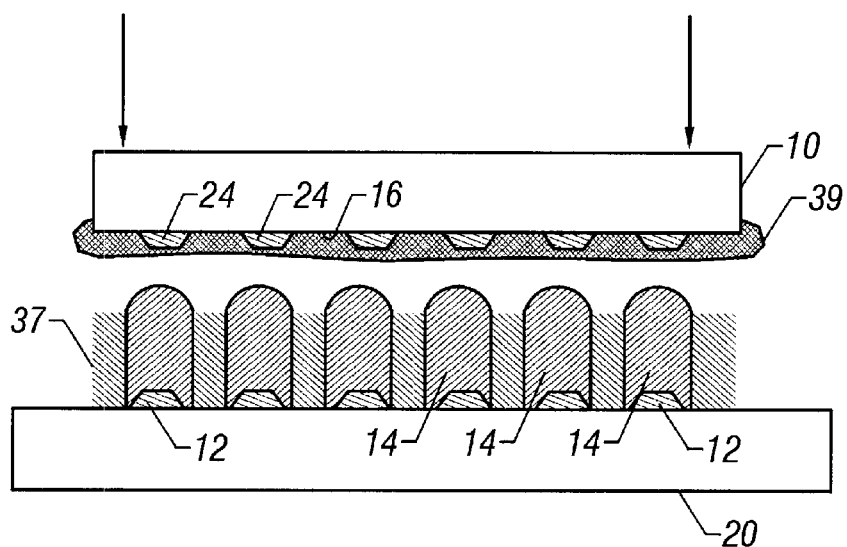
FIG. 26 illustrates flip-chip structure wherein the first portion of the encapsulant material is applied to a bumped substrate and the second portion is applied over the chip.
Figure 27:
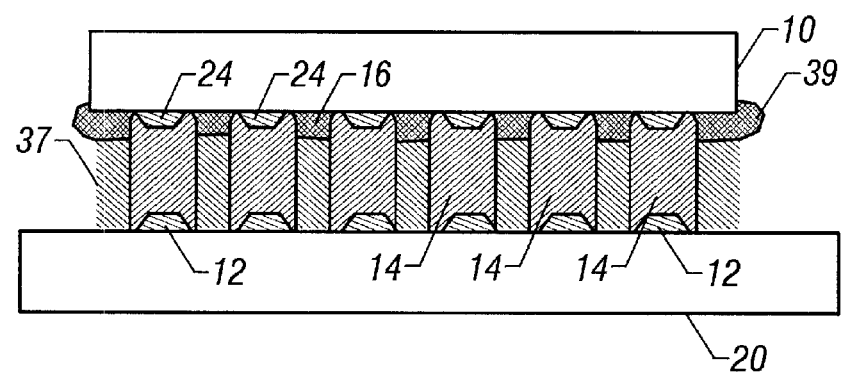
FIG. 27 illustrates flip-chip structures of FIG. 22 and FIG. 23 after solder reflow and encapsulant hardening.

As can be easily appreciated by one of ordinary skill in the art, any of the above-described embodiments can be modified by precoating the substrate, rather than the chip, with the encapsulant or encapsulant and solder combination as shown in FIGS. 22 through 27. In FIG. 22, the circuitry on the top surface 26 of the substrate 20 is coated with the first portion encapsulant 37. As illustrated in FIG. 23, the contact pads 12 on the substrate 20 are exposed by making vias 38 through the first portion encapsulant 37 as described previously. Alternately, the first portion encapsulant is printed with the vias already formed as shown in FIG. 23. As illustrated in FIG. 24, the vias 38 within the first portion encapsulant 37 are then filled with solder 30 as also described previously. In FIG. 25, the substrate solder bumps 14 and the encapsulant 37 are both coated with the polymer flux encapsulant 39 and the bare chip 10 is positioned to align with the solder bumps 14 on the substrate 20 with the metallized pads 24 on the chip. In FIG. 26, the chip metallization pads 24 are coated with the polymer flux encapsulant 39 and the coated chip 10 is positioned to align with the bumps 14 with the metallized pads 24. The solder 30 is reflowed to form the electrical connection between the chip 10 and the substrate 20 while the second portion encapsulant 39 bonds to the chip 20 and the first portion 37 to form the structural connection as shown in FIG. 27.

When implemented to manufacture integrated circuit chips, the inventive procedure is preferably performed prior to dicing the wafer on which the chips are fabricated, so the application of the encapsulating layers and solder bumps is done on many chips simultaneously. For example, FIGS. 28 and 29 illustrate a wafer 41 consisting of an array of undiced semiconductor chips 40, the first portion encapsulant 37 and the solder-filled openings 14 applied to the wafer metallization pads 12 on the surface of the wafer 20.

The present invention also provides chips with underfilling encapsulants pre-coated and pre-assembled on the chips for assembly to a substrate, wherein the encapsulant consists of more than one layer or portion, each portion performing one or more distinct functions such as adhesion, stress reduction, electrical redistribution, reworkability, or other functions.

EXAMPLE 1

Preparation of Encapsulant that is Suitable for Use as the Second Portion Encapsulant 39 in FIG. 16

The entitled encapsulant, comprising a polymer flux, was prepared from a mixture that contained:
1. 25 grams bisphenol A glycerolate di(2-octen-1-ylsuccinic) acid monoester;
2. 12.5 grams of bisphenol A epoxy; and
3. 4 grams of glycidyl 4-nonylphenyl ether.

This composition was mixed and cured for 4 hours at 165° C. It produced a solid having a thermal coefficient of expansion of about 180 ppm/° C.

EXAMPLE 2

Preparation of Two-Portion Liquid Underfill Encapsulants Applied Before Assembly A set of ten flip chip assemblies was fabricated. Specifically, a bumped semiconductor chip, part FBT-250 available from Flip Chip Technologies, Phoenix, Ariz., was coated with a first portion liquid encapsulant 111 as shown FIG. 10. The first portion of the encapsulant consisted of a liquid layer, approximately 50 to 75 microns thick, that covered the underside of the chip and the solder bumps completely. It was formed from a mixture that contained:
1. Bisphenol A epoxy 15 weight %;
2. Glycidyl 4-nonylphenyl ether 6 weight %;
3. Pentaeryethritol triacrylate 18 weight %
4. Tert-butyl peroxide 0.06 weight %;
5. Glass spheres 40 weight % (Aldrich catalog No. 44,034-5); and
6. Bisphenol A glycerolate di(2-octen-1-ylsuccinic) acid monoester 20.94 weight %.

The composition was mixed and cured for 4 hours at 165° C. It produced a solid having a thermal coefficient of expansion of less than 30 ppm/° C. and a storage modulus of greater than 2 GPa.

Separately, a printed circuit board substrate was fabricated with a matching pattern of solderable gold-plated copper pads, consisting of approximately 0.8 mm thick BT resin/glass laminate with approximately 30 microns of copper foil. The printed circuit had a solder mask which defined the matching soldering pads to be between 170–200 microns on each side, the solder mask comprising Morton Dynachem Conformask. The printed circuit board substrate was baked overnight at 120° C. then baked for 1 hour at 160° C. prior to assembly to expel moisture and trapped volatiles. Subsequently, the board was kept in a dessicator until used for assembly. A layer of the second portion liquid encapsulant of Example 1, approximately 30 microns thick, (corresponding to layer 109 of FIG. 10) was carefully applied to the printed circuit substrate with a stencil so as to avoid creating air bubbles in the printed layer.

Figure 11:
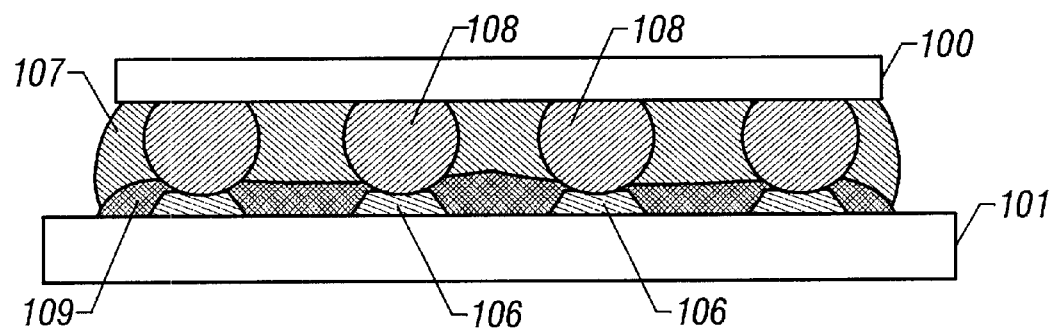
Figure 30:
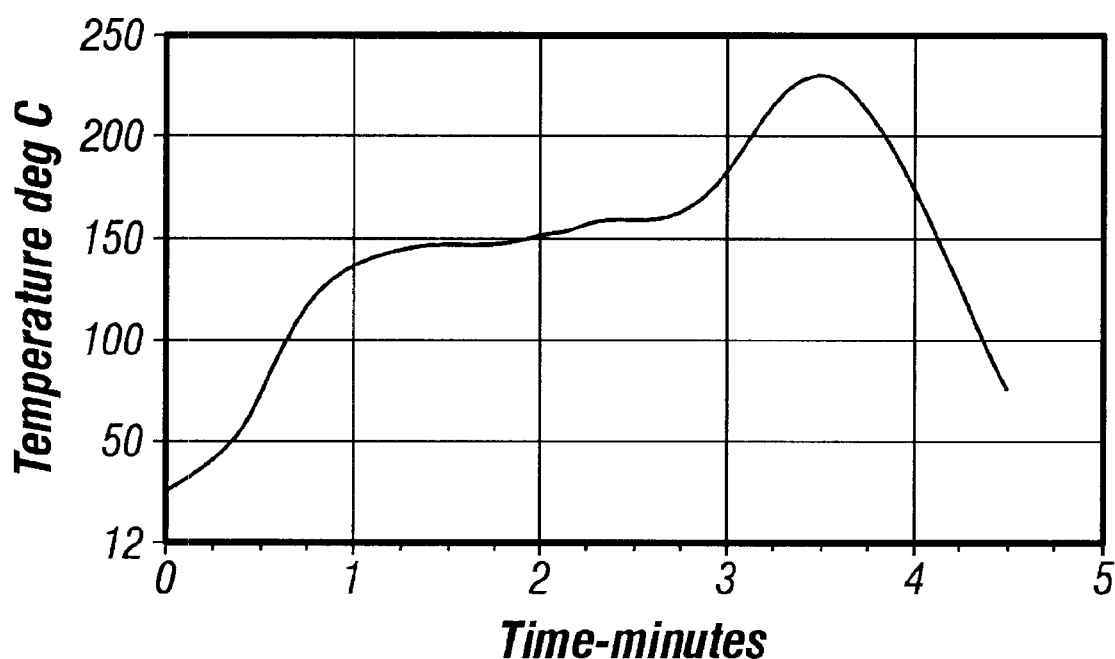
FIG. 30 is a graph of a thermal cycle (temperature vs. time) used during reflow.

As in FIG. 11, the solder bumps 108 on the chip were aligned to the metallization pads 106 on the substrate and the two parts were squeezed together thereby moving the solder 108 bumps into intimate contact with the soldering pads 106. During this operation, care was taken so as not to entrap any air in the interface between the substrate and chip. The solder was then reflowed in a convection/infra-red belt oven having a thermal reflow cycle as shown in FIG. 30. The process caused the solder bumps to melt and wet the metallized soldering pads and also to harden the two encapsulant portions, as shown in FIG. 12. Subsequently, the assemblies were post-cured for 2 hours at 165° C.

The assemblies were found to produce electrical interconnections at each and every soldering bump and pad, as demonstrated by electrical continuity testing. The assemblies were tested in an acoustic microscope to detect any voids left in the encapsulant, and none was found. Transmission x-ray testing indicated all the chip's solder bumps had aligned with the pads on the substrates. Five assemblies were tested for adhesion and solder wetting by shearing the chips from the substrates. The force needed to separate the assemblies was so great that it required use of a hammer and chisel. Separation of the chip from the assembly revealed most of the encapsulant remained attached to the substrates. The solder bumps were entirely remaining attached to the metallization pads after shearing the assemblies, leaving no visible solder on the chips. Three of the remaining assemblies were cross sectioned and examined under high magnification. The cross sections revealed that the solder bumps had completely melted and engulfed the top and sides of the metallization pads on the substrate, a confirmation of good solder wetting. The remaining two assemblies were subjected to 525 hours of highly accelerated stress testing (HAST), which consisted of constant 120° C., greater than 85% relative humidity and pressures exceeding 200 KPa. Neither of the parts failed as determined by electrical continuity measurements. A similar assembly fabricated with a commercial underfill encapsulant was found to fail the same test at 400 hours, indicating that the inventive assembly was more durable than the prior art underfill encapsulant assembly.

EXAMPLE 3

Preparation of Encapsulant that is Suitable for Use as the First Portion Encapsulant 37 in FIG. 16

2-allyl phenyl glycidyl ether was synthesized by heating 2-allyl phenol (AP) and 10 times excess molar ratio epichlorohydrin (EPH) to 115° C. under nitrogen in the presence of aqueous sodium hydroxide (NaOH). During the reaction, water which must be removed is formed by the reaction between 2-AP and EPH. Since water and EPH form an azeotrope, water was removed from the reaction by azeotropic distillation, which to drives the reaction forward. Collected EPH was returned as needed to the mixture to prevent undesirable side reactions. After 4 hours, the resultant salts were separated from the product. The product was then purified by extraction of the oil phase with toluene, followed by removing the excess EPH and aqueous phase with toluene, which was also used as an azeotropic agent. The product obtained was a thin, yellowish, transparent liquid. Yield was about 90%. Distillation at low pressure (0.3 mm of Hg) yielded a water white mobile liquid, identified as 2-allyl phenyl glycidyl ether, with a boiling point of 72–72° C.

A resin mixture of this product was then prepared and it contained:

1. 32.54 weight % bisphenol A epoxy;
2. 22.46 weight % cyanate ester resin;
3. 28.69 weight % cyanate ester resin;
4. 6.49 weight % bismaleimide resin;
5. 6.89 weight % 2-allyl phenyl glycidyl ether;
6. 0.5 weight % silane; and
7. 2.88 weight % of a pre-mixed solution consisting of 4 weight % copper (II) acetyl acetonate catalyst in 96 weight % DEN 438 epoxy resin.

In preparing this mixture, the bismaleimide and 2-ally phenyl glycidyl ether were mixed first and stirred at 115° C. for 5 hours. The mix was cooled to 90° C. and the remaining ingredients added and mixed thoroughly—until the solution cleared—one by one, the last added being the copper catalyst solution.

Next, another mixture of dry filler powder was prepared and it contained:

1. 28.24 grams of Min-U-Sil 40 silica powder (U.S. Silica);
2. 10.66 grams of H50/1000 EPX glass bubbles (3M Co.);
3. 25.58 grams of W410 zerosphere silica-alumina spheres (3M Co.).

64.48 grams of the dry powder mixture was blended by hand with 35.52 grams of the resin mixture made above. After rough blending, the mixture was further mixed for 10 minutes at 50 rpm at 50° C. in a Brabender roller blade mixer. The mix was then degassed in vacuo at 60–80° C. for one hour. A Hegman grind gauge was used to confirm the absence of aggregates in the mixture. This first portion encapsulant composition was mixed and cured for 2 hours at 165° C. and found to have produced a solid having a thermal coefficient of expansion of about 25–30 ppm/° C. and a storage modulus of greater than 2 GPa.

EXAMPLE 4

Preparation of a One-Portion Solid and One-Portion Liquid Underfill Encapsulants Applied Before Assembly A set of ten flip chip assemblies was produced as follows:

A bumped semiconductor chip, part FBT-250 was coated with the first portion liquid encapsulant produced in Example 3. The first portion of the encapsulant consisted of a liquid layer, approximately 50 to 60 microns thick, that covered the underside of the chip but was applied through a stencil to leave the solder bumps completely exposed. The first portion encapsulant which was applied to the flip chip was subsequently hardened by heating in an oven for 1 hour at 165° C.

Separately, a printed circuit board substrate was fabricated with a matching pattern of solderable gold-plated copper pads, as described in Example 2. The printed circuit board substrate was baked overnight at 120° C. then baked for 1 hour at 160° C. prior to assembly to expel moisture and trapped volatiles. Subsequently, the board was kept in a dessicator until used for assembly. A layer of the second portion liquid encapsulant prepared in Example 1, approximately 40 microns thick, was applied to the printed circuit substrate by means of a stencil.

As in FIG. 14, the solder bumps 108 on the chip were aligned to the metallization pads 106 on the substrate and the two parts were squeezed together, putting the solder 108 bumps into intimate contact with the soldering pads 106. The solder was then reflowed in a convection/infra-red belt oven having a thermal reflow cycle (FIG. 30) which wetted the solder bumps to the metallized soldering pads and hardened the second portion encapsulant (FIG. 15). Subsequently, the assemblies were post-cured for 2 hours at 165° C.

The assemblies were found to produce electrical interconnections at each and every soldering bump and pad, as demonstrated by electrical continuity testing. The assemblies were tested in an acoustic microscope to detect any voids left in the encapsulant, and only one was found. Five assemblies were tested for adhesion and solder wetting by attempting to shear the chips from the substrates. It was found impossible to separate the chips from the assemblies without completely destroying the chip, even when a hammer and chisel were employed as in Example 1. This indicated that the adhesion of the encapsulant to the chip was greater than the intrinsic strength of the chip itself. Three of the remaining assemblies were cross sectioned and examined under high magnification. The cross sections revealed that the solder bumps had completely melted and engulfed the top and sides of the metallization pads on the substrate, a confirmation of good solder wetting.

EXAMPLE 5

Preparation of One-Portion Solid Underfill Encapsulant Applied Before Assembly, Drilled and Filled with Solder An unbumped semiconductor wafer, comprised of part FBT-250 chips, was obtained with a vanadium-copper underbump metallization and a silicon nitride passivation layer. The wafer was coated by stencil printing with the first portion liquid encapsulant produced in Example 3, excepting no powder filler was employed. The first portion of the encapsulant consisted of a liquid layer, approximately 75 microns thick, that covered the entire underside of the wafer including the metallized pads. The first portion encapsulant was subsequently hardened by heating in an oven for 2 hours at 165° C.

Openings were created in the first portion encapsulant by laser drilling. An excimer laser was employed operating at 248 nanometers with a focused spot diameter of 113 microns and a shot power of 0.13 to 0.25 Joules/cm$^2$. Between 400 and 500 shots were used to drill each opening, taking care not to penetrate into the metallization. Drilling was done in a helium jet. The openings created were 95–110 microns at the surface of the encapsulant and tapered down to about 70–80 microns at the surface of the wafer. The openings in the solid first portion exposed the underlying chip metallization pads.

Subsequently, the wafer was cleaned in isopropanol in an ultrasonic bath (Sonix IV). This was followed by etching in a YES plasma chamber for ten minutes in oxygen, followed by five minutes in nitrogen. The openings were then filled with solder paste SMQ92 from Indium Corporation by stencil printing. The wafers were then passed through a solder reflow cycle, similar to that shown in FIG. 30, in a nitrogen atmosphere to create the solder bumps.

The wafer was cross sectioned and examined under scanning electron microscopic magnification. The cross sections revealed that the solder paste had completely melted and engulfed the top of the metallization pads on the wafer, a confirmation of good solder wetting. A thin layer of tin-copper intermetallic was confirmed present throughout the bottom of the solder bump, which also confirmed good solder wetting.

EXAMPLE 6

Preparation of a One-Portion Solid Underfill Encapsulant Applied Before Assembly by Lamination, Drilled and Filled with Solder An unbumped semiconductor wafer, comprised of part FBT-250 chips, was obtained with a vanadium-copper underbump metallization and a silicon nitride passivation layer. The wafer was coated by laminating with a 50 micron thick layer of UPILEX polyimide film coated with a thin layer of polyimide siloxane thermoplastic adhesive, available from Oxychem, Grand Island, N.Y. The film has a storage modulus of over 5 GPa and a thermal expansion coefficient in the plane of the film of less than 20 ppm/° C. The first portion encapsulant was laminated in an autoclave at a pressure of 350 KPa and a temperature of 180° C. for 2 hours.

Openings were created in the first portion encapsulant by laser drilling. An excimer laser was employed operating at 248 nanometers with a focused spot diameter of about 120 microns and a shot power of 0.10 to 0.25 Joules/cm$^2$. Between 200 and 400 shots were used to drill each opening, taking care not to penetrate into the metallization. Drilling was done in ambient air. The openings created were 95–120 microns at the surface of the encapsulant and tapered down to about 70–80 microns at the surface of the wafer. The openings in the solid first portion exposed the underlying chip metallization pads.

Subsequently, the wafer was cleaned in isopropanol in an ultrasonic bath (Sonix IV). This was followed by etching in a YES plasma chamber for ten minutes in oxygen, followed by five minutes in nitrogen. The openings were then filled with solder paste SMQ92 from Indium Corporation by stencil printing. The wafers were then passed through a solder reflow cycle, similar to that shown in FIG. 30, in a nitrogen atmosphere to create the solder bumps.

The wafer was diced into singulated chips. Some of the chips produced were cross sectioned and examined under scanning electron microscopic magnification. The cross sections revealed that the solder paste had melted and wetted the top of the metallization pads on the wafer. A thin layer of tin-copper intermetallic was confirmed present at the bottom of the solder bump. A portion of the solder was observed to protrude the surface of the first portion encapsulant by approximately 20 microns.

Separately, a printed circuit board substrate was fabricated with a matching pattern of solderable gold-plated copper pads and prepared, as described in Example 2. A layer of the second portion liquid encapsulant prepared in Example 1, approximately 25 microns thick, was applied to the printed circuit substrate by means of a stencil.

As in FIGS. 16 and 17, the solder bumps 14 on the chip were aligned to the metallization pads 12 on the substrate and the two parts were squeezed together, putting the solder 14 bumps into intimate contact with the soldering pads 12. The solder was then reflowed in a convection/infra-red belt oven having a thermal reflow cycle (FIG. 30) which wetted the solder bumps to the metallized soldering pads and hardened the second portion encapsulant. The assemblies were found to produce electrical interconnections at the soldering bumps and pads, as demonstrated by electrical continuity testing.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. An electrical component assembly, comprising:
   (a) a substrate having a substrate surface with a plurality of pads thereon;
   (b) an integrated circuit chip having an active surface with a plurality of contacts thereon wherein the substrate surface faces the active surface; and
   (c) an encapsulant interposed between said substrate and the integrated circuit chip wherein the encapsulant comprises at least two layers including
      (i) a first layer comprising a polymer or polymer composite having a coefficient of thermal expansion of about 30 ppm/° C. or less and an elastic modulus of at least about 2 Gpa; and
      (ii) a second layer comprising a polymer flux; wherein the encapsulant defines a plurality of channels that are filled with solder and wherein each channel extends from a contact on the active surface to a pad on the substrate surface.

2. The electrical component assembly of claim 1 wherein the first layer comprises a polymer and an inorganic filler.

3. The electrical component assembly of claim 1 wherein the first layer comprises a laminated polymer film having a coefficient of thermal expansion about 30 ppm/° C. or less and an elastic modulus of at least about 2 GPa in the plane of the structure.

4. The electrical component assembly of claim 1 wherein the first layer has a thickness that is equal to or greater than that of the second layer and the total thickness of the two layers is between about 20 and 300 microns.

5. The electrical component assembly of claim 4 wherein the first layer has a thickness that is equal to or greater than that of the second layer and the total thickness of the two layers is between about 20 and 150 microns.

6. The electrical component assembly of claim 5 wherein the first layer is thicker than the second layer and the total thickness of the two layers is between about 20 and 75 microns.

7. The electrical component assembly of claim 6 wherein the thickness of the second layer is between about 5 and 30 microns thick at its thickest point.

8. The electrical component assembly of claim 1 wherein the first layer comprises a material having a coefficient of thermal expansion of between about 10 and 30 ppm/° C. and an elastic modulus of between about 2 and 12 GPa.

9. The electrical component assembly of claim 8 wherein the first layer comprises a material having a coefficient of thermal expansion of between about 12 and 28 ppm/° C. and an elastic modulus of between about 3 and 10 GPa.

10. The electrical component assembly of claim 9 wherein the first layer comprises a material having a coefficient of thermal expansion of between about 18 and 27 ppm/° C. and an elastic modulus of between about 3 and 8 GPa.

\* \* \* \* \*